United States Patent
Cho et al.

(10) Patent No.: US 7,175,880 B2
(45) Date of Patent: Feb. 13, 2007

(54) SURFACE TREATMENT SYSTEM AND METHOD

(75) Inventors: Cheon-Soo Cho, Gyeongsangnam-Do (KR); Dong-Sik Youn, Gyeongsangnam-Do (KR); Hyun-Wook Lee, Gyeongsangnam-Do (KR); Samchul Ha, Gyeongsangnam-Do (KR); Hyun-Woo Jun, Gyeongsangnam-Do (KR)

(73) Assignee: LG Electronics Inc., Seoul (KR)

( * ) Notice: Subject to any disclaimer, the term of this patent is extended or adjusted under 35 U.S.C. 154(b) by 39 days.

(21) Appl. No.: 10/496,219

(22) PCT Filed: Dec. 28, 2002

(86) PCT No.: PCT/KR02/02471

§ 371 (c)(1),
(2), (4) Date: May 20, 2004

(87) PCT Pub. No.: WO03/083168

PCT Pub. Date: Oct. 9, 2003

(65) Prior Publication Data
US 2005/0051090 A1 Mar. 10, 2005

(30) Foreign Application Priority Data
Mar. 29, 2002 (KR) ...................... 10-2002-0017512

(51) Int. Cl.
  *C23C 16/00* (2006.01)
(52) U.S. Cl. .................. 427/248.1; 427/569; 118/719; 118/723 E; 118/723 R
(58) Field of Classification Search .............. 118/729, 118/719, 720, 723 E, 723 R; 427/248.1, 427/255.5, 569
See application file for complete search history.

(56) References Cited

U.S. PATENT DOCUMENTS

| | | | |
|---|---|---|---|
| 4,501,766 A | | 2/1985 | Suzuki et al. |
| 4,728,406 A | * | 3/1988 | Banerjee et al. ........ 204/192.29 |
| 4,834,020 A | | 5/1989 | Bartholomew et al. |
| 5,122,391 A | * | 6/1992 | Mayer ...................... 427/126.3 |
| 5,124,180 A | * | 6/1992 | Proscia ................... 427/255.35 |
| 5,545,436 A | * | 8/1996 | Saito ...................... 427/255.37 |
| 5,599,403 A | * | 2/1997 | Kariya et al. ................ 136/258 |
| 5,944,900 A | * | 8/1999 | Tran ........................... 118/715 |
| 5,976,258 A | * | 11/1999 | Kleiner ....................... 118/718 |
| 6,171,396 B1 | * | 1/2001 | Tahara ......................... 117/204 |
| 6,447,612 B1 | * | 9/2002 | Moriyama et al. .......... 118/718 |
| 6,666,923 B1 | * | 12/2003 | Jeong et al. ................. 118/718 |
| 6,705,245 B1 | * | 3/2004 | Jeong et al. ............. 118/723 E |
| 6,827,787 B2 | * | 12/2004 | Yonezawa et al. .......... 118/718 |

FOREIGN PATENT DOCUMENTS

| | | |
|---|---|---|
| EP | 0 909 836 | 4/1999 |
| WO | WO 99/27157 | 6/1999 |

* cited by examiner

*Primary Examiner*—Bret Chen
(74) *Attorney, Agent, or Firm*—Birch, Stewart, Kolasch & Birch, LLP

(57) ABSTRACT

A surface treatment system in which gas for a deposition reaction is injected into a deposition chamber and power is applied to form a deposition reaction to form a deposition layer at a surface of an object or surface treatment, wherein the deposition chamber has a plurality of deposition spaces disposed in parallel and a convey unit for conveying one or more objects of surface treatment to each deposition space or discharging the objects of surface treatment from each deposition space after a deposition reaction.

26 Claims, 2 Drawing Sheets

SURFACE TREATMENT SYSTEM AND METHOD

TECHNICAL FIELD

The present invention relates to a surface treatment system and method and, more particularly, to a surface treatment system and method for forming a deposition layer on a surface of an object of surface treatment by using a deposition reaction.

BACKGROUND ART

In general, a surface treatment is to make a surface of a product made of a material such as a metal look good, or to improve a surface to have heat resistance, corrosion resistance, abrasion resistance, etc. so that a function of the product can be improved according to a condition of usage of the product. That is, the surface treatment is concealing inner defects, etc. by properly treating a surface of the metal.

The surface treatment includes plating on a surface of an accessory, chromium plating on brass, or a tinplating for iron sheet, etc.

The surface treatment methods include alumite for protecting an inside of an object of surface treatment by making oxide layer, an anticorrosive coating by paint, a chemical vapor deposition (CVD) reaction, or a physical vapor deposition (PVD) reaction.

In the meantime, a heat exchanger used in an air conditioner, a refrigerator, a heating apparatus, etc. is a device for transferring heat from fluid of high temperature to fluid of low temperature through a heat transfer wall. At this time, a flow of the fluid becomes different according to a characteristic of a surface of the heat transfer wall, and the characteristic of the surface of the heat transfer wall greatly influences to a heat exchange efficiency of the heat exchanger.

Accordingly, a radiator surface of the heat exchanger is required to have a surface treatment having various characteristics according to a performance of the heat exchanger. To this end, fins of the heat exchanger are fabricated by processing a sheet having a treated surface to improve hydrophilicity, hydrophobicity, or corrosion resistance.

Also, the sheet for processing the fins of the exchanger has a surface treatment that forms a deposition layer at the surface of the sheet by using the chemical vapor deposition reaction or the physical vapor deposition reaction.

In the meantime, for the surface treatment, reaction gas is injected in a deposition chamber and then power is applied thereto for a deposition reaction. A method for applying power includes a method for applying power to the object of surface treatment for the deposition reaction.

In the conventional surface treatment method represented in PCT Publication No. WO9927157, power is directly applied to an object of surface treatment in a polymerization chamber injected by reaction gas to cause a plasma polymerization reaction, thereby forming a deposition layer at a surface of the object of surface treatment.

Meanwhile, when a product finishes the surface treatment, it is generally undergoes a process such as manufacturing, molding, etc. according to desired conditions and shapes, during which, however, a cut section or the deposition layer may be damaged or the product may be assembled with other member without surface treatment.

That is, when the object which has been surface processed in large quantities to have quality desired for use conditions is subjected to the process such as the molding or the assembling, the surface of the object of surface treatment may be damaged or there may be a member not having such a desired quality, which would result in reduction of an effect of the surface treatment.

In addition, in order to enhance productivity in surface treatment of a object of surface treatment, a surface treatment system for forming deposition layer at a surface of the object of surface treatment in large quantities is needed.

In addition, in order to surface-process a product, that is, an object of surface treatment, to allow the product to have quality or characteristics suitable for desired conditions, flowing of gas for a deposition reaction have much influence on formation and quality of a deposition layer. Thus, a surface treatment system having gas flow suitable to form a deposition layer having a desired quality or desired characteristics is needed.

DISCLOSURE OF THE INVENTION

Therefore, it is an object of the present invention to provide a surface treatment system which has a deposition chamber with a plurality of deposition spaces to form a deposition layer at a surface of an object of surface treatment and is capable of surface-processing in large quantities, and its surface treatment method.

Another object of the present invention is to provide a surface treatment system which has a deposition chamber with a plurality of deposition spaces to form a deposition layer at a surface of an object of surface treatment and has gas flow suitable for a surface-processing in large quantities.

To achieve the above object, there is provided a surface treatment system in which gas for a deposition reaction is injected into a deposition chamber and power is applied to form a deposition reaction to form a deposition layer at a surface of an object of surface treatment, wherein the deposition chamber has a plurality of deposition spaces disposed in parallel and a convey unit for conveying one or more objects of surface treatment to each deposition space or discharging the objects of surface treatment from each deposition space after a deposition reaction.

In the surface treatment system of the present invention, a gas discharge unit is disposed at the center in the deposition chamber to divide the deposition space into two sections, and a gas injection unit for injecting gas for a deposition reaction into the deposition space is installed at both sides of the deposition chamber.

The achieve the above objects, there is also provided there is provided a surface treatment method in which gas for a deposition reaction is injected into a deposition chamber and power is applied to form a deposition reaction to form a deposition layer at a surface of an object of surface treatment, wherein a plurality of deposition spaces are formed in parallel in the deposition chamber, one or more objects of surface treatment are conveyed into each deposition space, and the objects of surface treatment are discharged from each deposition space after the deposition reaction for forming a deposition layer at the surface of the objects of surface treatment.

MODES FOR CARRYING OUT THE PREFERRED EMBODIMENTS

A surface treatment system and a surface treatment method in accordance with the present invention will now be described with reference to the accompanying drawings.

Elements other than those requisite for constituting the surface treatment system of the present invention are omitted in the specification and drawings for simplicity purpose.

Figure 1:
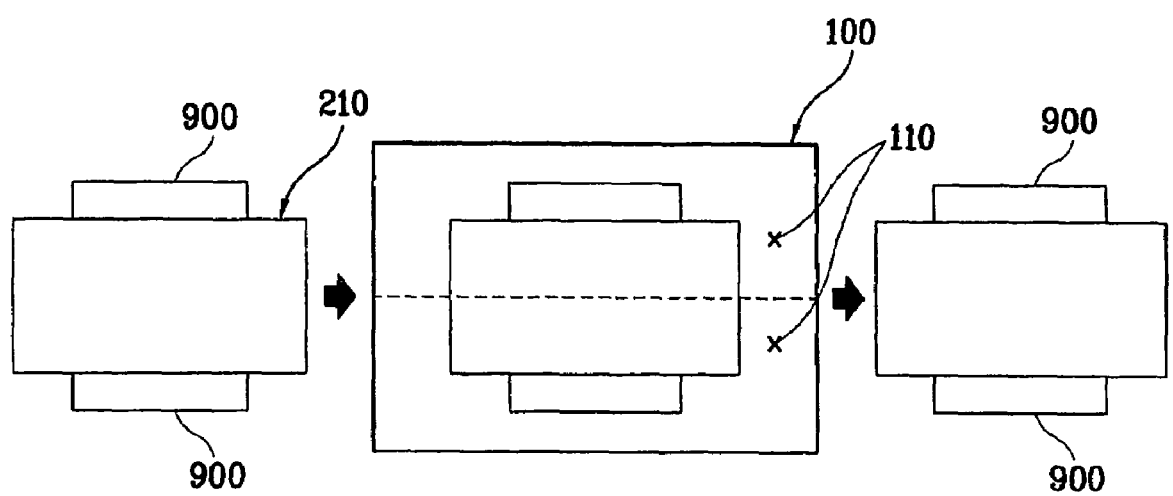
FIG. 1 is a conceptual view showing a surface treatment system in accordance with the present invention.

FIG. 1 is a conceptual view showing a surface treatment system in accordance with the present invention.

A surface treatment system in accordance with the present invention is featured in that gas for a deposition reaction is injected into a deposition chamber 100, to which power is applied to form a deposition reaction to form a deposition layer at a surface of an object of surface treatment 900, of which the deposition chamber 100 has a plurality of deposition spaces 110 disposed in parallel and a convey unit for conveying one or more objects of surface treatment 900 into each of the deposition space 10 or discharging the objects of surface treatment 900 from each deposition space 110 after the deposition reaction.

A deposition reaction for the surface treatment includes the chemical vapor deposition (CVD) reaction, the physical vapor deposition (PVD) reaction, etc., and especially, the preferred embodiment of the present invention adopts the plasma deposition reaction as disclosed in PCT publication No. WO9927156, one of the conventional surface treatment methods.

Namely, in the surface treatment system in accordance with the present invention, gas for a deposition reaction is injected into the deposition chamber 100, to which power is applied to form plasma deposition reaction, that is, the deposition reaction, to form a deposition layer at a surface of an object of surface treatment.

Though the deposition reaction in the present invention mainly focuses on descriptions of the polymerization layer, it also can be adoptable to a surface treatment system, regardless of types of deposition reaction, in which gas for a deposition reaction is injected into the deposition chamber, to which power is applied to form a deposition reaction to form a deposition layer at the surface of the object of surface treatment 900.

The gas injected into the deposition chamber 100 allows a desired deposition layer to be formed at the object of surface treatment 900, and as the power, a radio frequency (RF) power or a DC power can be used. The object of surface treatment 900 can be used as one electrode.

The convey unit simultaneously conveys/discharges the objects of surface treatment 900 to/from each of the deposition spaces 110, so that it can surface-process them in large quantities.

Figure 2:
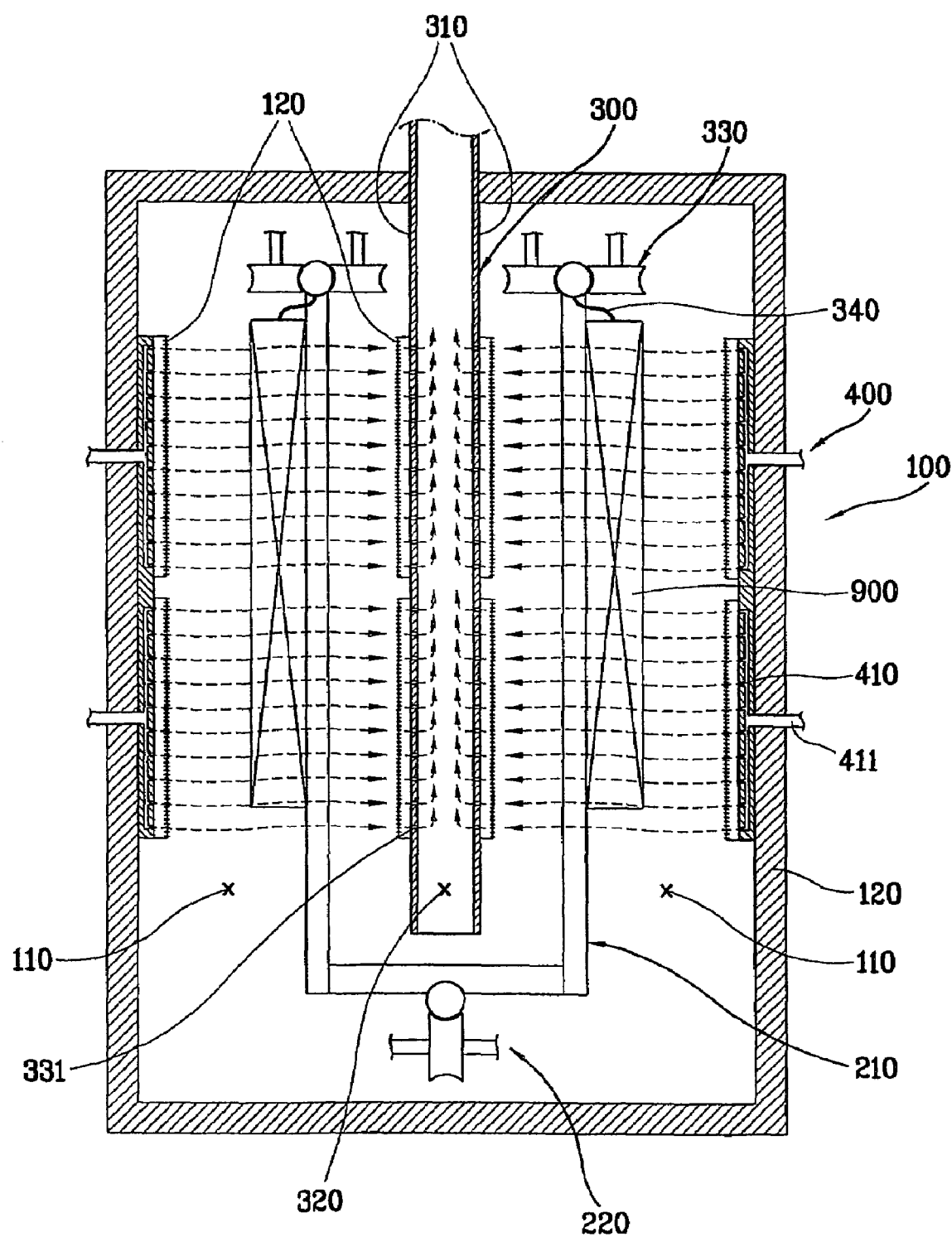
FIG. 2 illustrates the construction of the surface treatment system in FIG. 1.

FIG. 2 illustrates the construction of the surface treatment system in FIG. 1.

As shown in FIG. 2, the convey unit includes a mounting unit 210 for mounting one or more objects of surface treatment 900 and a moving unit 220 for moving the mounting unit 210.

The mounting unit 210 can mount a plurality of objects of surface treatment 900 thereon and can simultaneously advance into the plurality of deposition spaces 110.

The convey unit, serving to perform a function of mounting and moving the object of surface treatment 900, can be diversely modified with general efforts.

There can be several method for forming a plurality of deposition spaces 110 in the deposition chamber 100, and in the present invention, as shown in FIG. 2, the surface treatment system has two deposition spaces 110 with the gas discharge unit 300 disposed at the center of the deposition chamber 100.

The surface treatment system of the present invention includes a gas injection unit 400 installed at both sides of the deposition chamber 100, through which gas for a deposition reaction is injected into the deposition space 110.

With the configuration of the gas injection unit 400 and the gas discharge unit 300, gas flows in the direction indicated by arrows in FIG. 2.

The gas injection unit 400 is installed at an inner side of the wall 120 of the deposition chamber 100 and includes a connection pipe 411 connected to a gas supply unit (not shown) and injection holes 410 for injecting gas into the deposition space 110.

The injection holes 410 are constructed such that they are densely formed as being distanced from the connection pipe 411 so that the gas can be uniformly distributed in the deposition space 110.

The gas discharge unit 300 includes a pair of compartment plates with a is discharge passage 320 for discharging the deposition reaction-finished gas outwardly of the deposition chamber 100 formed therebetween. The pair of compartment plates include a plurality of holes 331 to allow gas to pass therethrough.

In the surface treatment system, in order to apply power for a deposition reaction to the deposition space 110, as shown in FIG. 2, electrodes 120 may be installed by pairs at both sides of each deposition space 110. The electrode 120 is formed platy, may have a plurality of holes (not shown) formed to allow gas to pass therethrough, or may have a mesh form.

Reference numerals 330 and 340 are respectively indicate an power applying unit and a connecting line electrically connecting the object of surface treatment 900 and the power applying unit 330.

The operation of the surface treatment system constructed as described above in accordance with the present invention will now be explained.

First, one or more objects of surface treatment 900 are mounted on the mounting unit 210 of the convey unit and conveyed into the deposition chamber 100. According to configuration, the objects of surface treatment 900 may be mounted on the mounting unit 210 and conveyed into the plurality of deposition spaces 110 of the deposition chamber 100.

After the objects of surface treatment 900 are conveyed into the deposition chamber 100, the deposition chamber 100 is closed and sealed by an open and shut unit (not shown), and gas for forming a deposition layer is injected into the deposition space 110 through the gas injection unit 400. And then, power is applied through the electrodes 120 in the deposition chamber 100. As a deposition reaction takes place in the deposition space, a deposition layer is formed at the surface of the object of surface treatment 900.

The deposition reaction-finished gas is discharged from the deposition chamber 100 through the discharge passage 320 of the gas discharge unit 300 according to a gas flow formed by the gas injection unit 400 and the gas discharge unit 300.

After the deposition layer is formed at the surface of the object of surface treatment 900, the deposition chamber 100 is opened by the open and shut unit (not shown), and the mounting unit 210 with the object of surface treatment 900 mounted thereon is discharged from the deposition chamber 100 by the moving unit 220.

As so far described, the surface treatment system of the present invention has the following advantages.

That is, since there are formed a plurality of deposition spaces to form a deposition layer for one or more objects of surface treatment, the objects of surface treatment can be surface-processed in large quantities. Thus, a surface treatment cost can be reduced.

In addition, the surface treatment system can surface-process a product that has already undergone a process such as assembling or molding, etc. so that a damage to a product which may be done during the process such as assembling or molding can be prevented, and thus, surface treatment-desired products can be surface-processed in large quantities.

It will be apparent to those skilled in the art that various modifications and variations can be made in the surface treatment system and method of the present invention without departing from the spirit or scope of the invention. Thus, it is intended that the present invention cover modifications and variations of this invention provided they come within the scope of the appended claims and their equivalents.

The invention claimed is:

1. A surface treatment system in which gas for a deposition reaction is injected into a deposition chamber and power is applied to form a deposition reaction to form a deposition layer at a surface of one or more objects of surface treatment, wherein the deposition chamber has a plurality of deposition spaces disposed in parallel with said deposition spaces being separated by a gas discharge unit and a convey unit for conveying the objects of surface treatment to each deposition space or discharging the objects of surface treatment from each deposition space after a deposition reaction.

2. The system of claim 1, wherein the convey unit simultaneously conveys/discharges one or more objects of surface treatment into/from each deposition space.

3. The system of claim 2, wherein the convey unit comprises: a mounting unit for mounting one or more objects of surface treatment thereon; and a moving unit for moving the mounting unit.

4. The system of claim 2, wherein the mounting unit mounts one or more objects of surface treatment.

5. The system of claim 1, wherein there are provided two deposition spaces.

6. The system of claim 1, wherein the gas discharge unit is disposed at the center in the deposition chamber to divide the deposition space into two sections, and a gas injection unit for injecting gas for a deposition reaction into the deposition space is installed at both sides of the deposition chamber.

7. The system of claim 6, wherein electrodes for applying power into the deposition space are installed by pairs at both sides of each deposition space.

8. The system of claim 7, wherein the electrodes allow gas for a deposition gas to pass therethrough.

9. The system of claim 7, wherein the electrodes include a plurality of holes to allow gas to pass therethrough.

10. The system of claim 7, wherein the electrodes have mesh form to allow gas for a deposition reaction to pass therethrough.

11. The system of claim 6, wherein the gas injection unit is installed at both sides of the deposition chamber perpendicular to a moving path of the object of surface treatment.

12. The system of claim 6, wherein the gas injection unit includes a plurality of injection holes formed at both sides of the deposition chamber.

13. The system of claim 6, wherein the gas discharge unit includes a pair of compartment plates with a discharge passage for discharging the deposition reaction-finished gas outwardly of the deposition chamber formed therebetween, and the pair of compartment plates include a plurality of holes to allow a gas to pass therethrough.

14. The system of claim 6, wherein the convey unit simultaneously conveys/discharges one or more objects of surface treatment into/from each deposition space.

15. The system of claim 14, wherein the convey unit comprises: a mounting unit for mounting one or more object of surface treatment thereon; and a moving unit for moving the mounting unit.

16. The system of claim 14, wherein the mounting unit mounts one or more objects of surface treatment.

17. The system of claim 1, wherein the deposition reaction is a chemical vapor deposition reaction.

18. The system of claim 1, wherein the deposition reaction is a plasma deposition reaction.

19. The system of claim 1, wherein power is applied to the object of surface treatment.

20. A surface treatment method in which gas for a deposition reaction is injected into a deposition chamber and power is applied to form a deposition reaction to form a deposition layer at a surface of an object of surface treatment, comprising.

forming a plurality of deposition spaces in parallel in the deposition chamber, conveying one or more objects of surface treatment into each deposition space, and discharging the objects of surface treatment from each deposition space after the deposition reaction for forming a deposition layer at the surface of the object of surface treatment.

21. The system of claim 3, wherein the mounting unit mounts one or more objects of surface treatment.

22. The system of claim 11, wherein the gas injection unit includes a plurality of injection holes formed at both sides of the deposition chamber.

23. The system of claim 11, wherein the gas discharge unit includes a pair of compartment plates with a discharge passage for discharging the deposition reaction-finished gas outwardly of the deposition chamber formed therebetween, and the pair of compartment plates include a plurality of holes to allow a gas to pass therethrough.

24. The system of claim 15, wherein the mounting unit mounts one or more objects of surface treatment.

25. The method of claim 20, wherein the step of forming a plurality of deposition spaces in parallel in the deposition chamber includes physically separating the plurality of deposition spaces from one another.

26. The method of claim 20, wherein the step of forming a plurality of deposition spaces in parallel in the deposition chamber includes disposing a gas discharge unit at the center of the deposition chamber to divide the deposition spaces into two sections.

* * * * *